United States Patent
Combe et al.

(10) Patent No.: US 6,859,391 B1
(45) Date of Patent: Feb. 22, 2005

(54) EEPROM ARCHITECTURE AND PROGRAMMING PROTOCOL

(75) Inventors: Marylene Combe, Rousset (FR); Jean-Michel Daga, Rousset (FR); Stephane Ricard, Marseilles (FR); Marc Merandat, Venelles (FR)

(73) Assignee: Atmel Corporation, San Jose, CA (US)

( * ) Notice: Subject to any disclaimer, the term of this patent is extended or adjusted under 35 U.S.C. 154(b) by 46 days.

(21) Appl. No.: 10/737,676

(22) Filed: Dec. 15, 2003

(30) Foreign Application Priority Data

Sep. 15, 2003 (FR) .......................................... 03 10800

(51) Int. Cl.⁷ .......................... G11C 16/04; G11C 16/06
(52) U.S. Cl. ............................ 365/185.05; 365/185.23; 365/185.25
(58) Field of Search ...................... 365/185.05, 185.21, 365/185.23, 185.25, 185.29, 185.33

(56) References Cited

U.S. PATENT DOCUMENTS

| | | | |
|---|---|---|---|
| 5,363,330 A | 11/1994 | Kobayashi et al. ......... | 365/185 |
| 5,615,149 A * | 3/1997 | Kobayashi et al. ..... | 365/185.12 |
| 5,623,447 A | 4/1997 | Shimoda ................ | 364/189.04 |
| 5,828,604 A * | 10/1998 | Kawai et al. .......... | 365/185.21 |
| 6,016,270 A | 1/2000 | Thummalapally et al. ..................... | 365/185.11 |
| 6,031,785 A | 2/2000 | Park et al. ............. | 365/230.08 |
| 6,032,248 A | 2/2000 | Curry et al. ................... | 712/37 |
| 6,172,917 B1 * | 1/2001 | Kataoka et al. ........ | 365/189.05 |
| 6,512,693 B2 | 1/2003 | Honda et al. .......... | 365/185.13 |
| 6,687,164 B2 * | 2/2004 | Matsuda et al. ....... | 365/185.29 |

* cited by examiner

*Primary Examiner*—Trong Phan
(74) *Attorney, Agent, or Firm*—Thomas Schneck

(57) ABSTRACT

An EEPROM memory circuit in which the loading of the column latches can be performed simultaneously with reading of the memory array. In this memory circuit, the data input connects directly to the column latches, leaving the bit lines open for memory reading by the sense amplifiers, which is connected directly to the bit lines. Two separate Y address decoders, one feeding into the column latches and the other into the bit line select circuit, provide column latch and bit line selection respectively.

12 Claims, 3 Drawing Sheets

EEPROM ARCHITECTURE AND PROGRAMMING PROTOCOL

TECHNICAL FIELD

The present invention relates to page-mode programmable non-volatile semiconductor memory circuits in which a plurality of words or bytes of data can be programmed at one time, and to methods of operating the same.

BACKGROUND ART

A typical electrically erasable and programmable non-volatile memory cell (EEPROM) retains binary data by storing an amount of electrical charge on a floating gate structure in MOS transistors. By convention, a charged floating gate represents the logic "1" state (erased state) while an uncharged floating gate represents the logic "0" state (programmed state). To infuse the floating gate of a MOS transistor with electrons (i.e. to erase), a high voltage Vpp is applied to its gate while its source is connected to ground. A charged floating gate increases the threshold voltage of the transistor. To discharge the floating gate device (i.e. to program), Vpp is applied to its drain and its gate is connected to ground.

FIG. 1 shows how floating gate transistors 10 are typically connected in an EEPROM memory array 22. Each floating gate transistor 10 is paired up with an access transistor 12, forming a memory cell, in which the source of the access transistor 12 is connected to the drain of the floating gate transistor 10. The drain of the access transistor 12 taps into a bit line 16 that is common to the drains of all of the access transistors 12 in the same column. The source of the floating gate transistor 10 is connected to ground. A data column latch 24 is connected to one end of the bit line 16 and a bit line select transistor 28 is connected to the other end. The gate of the access transistor 12 is connected to a word line 20 that is common to the gates of all of the access transistors 12 in the same row. The floating gate transistors 10 in each row are typically subdivided into word or byte size groups and the gates of the floating gate transistors 10 in each group are connected to the source of a word select transistor 14. The drain of the word select transistor 14 connects to a Vref line 18 that provides a stable reference voltage to the memory cell during read or connects to Vpp during erase. One end of the Vref line 18 is connected to a Vref column latch 26 and the other end is connected to a reference voltage block 40 through a transistor 30 that is controlled by an address decoder 42. The gate of the word select transistor 14 is connected to the word line 20.

The programming of memory cell proceeds in three stages: load, erase and write. In the load stage, a Y address decoder 44 receives a coded address and sends a decoded address 42 to the bit line selection block 32, turning on selected bit line select transistors 28, which provides a direct connection between the selected column latches 25 and selected data input terminal 38. The connection allows the signals in the data input terminal 38 to be applied to selected bit lines 16. With an assertive signal applied at the load terminal 46 of column latches 24, the data signals from the data input terminal 38 is latched onto the column latches 24.

In the erasure stage, electrons are injected into the floating gate structure by holding the gates of floating gate transistor 10 at an elevated voltage Vpp, while at the same time grounding its drain. The Vpp is provided from elevated voltage (Vpp) terminal 48 by the Vref column latch 26 through the word select transistor 14. Both of the word select transistor 14 and the access transistor 12 are turned on by an X address decoder 50 through the word line 20. Once the content in selected memory cells are erased, it is ready to be written.

During the write stage, the X address decoder 50 continues to apply a high voltage Vpp to the gates of word select transistors 14 and the access transistors 12. At the same time, the bit line column latch 24 applies a high voltage Vpp or high impedance to the selected bit lines 16 depends on whether the stored data is a logic "0" or a logic "1". When a Vpp is exerted on the bit line 16, electron charges are extracted from the floating gate structure of the selected floating gate transistors 10, thereby programming the transistor 10 for the storage of a logic "0". When a high impedance present on the bit line 16, nothing will happen to the floating gate transistor 14, which will retain its erase state of logic "1".

In a read operation, the X address decoder 50 and Y address decoder 44 specify the location of memory. The memory contents in the specified memory are then presented onto the bit line 16. A sense amplifier 36 connected at one end of the bit line detects the data signal and sends them out to an output terminal 37.

From the above description, it should be clear that both the loading and the reading operation require the service of the Y address decoder 44, the bit line 16, the bit line select circuit 32 and therefore, the two steps cannot be performed simultaneously. However, it would be desirable to have a system wherein the reading and loading operation can be performed simultaneously, thereby speeding up the memory access processes.

DISCLOSURE OF THE INVENTION

The present invention enables the simultaneous loading and reading of a memory structure by (1) a combination of providing two separate Y address decoders, one connected to a bit line select circuit for reading purposes and the other connected to a column latch circuit solely for loading purposes, and (2) connecting the data input terminal directly and exclusively to the column latch circuit, thereby freeing up the bit lines for the reading operation.

BEST MODE FOR CARRYING OUT THE INVENTION

Figure 2:
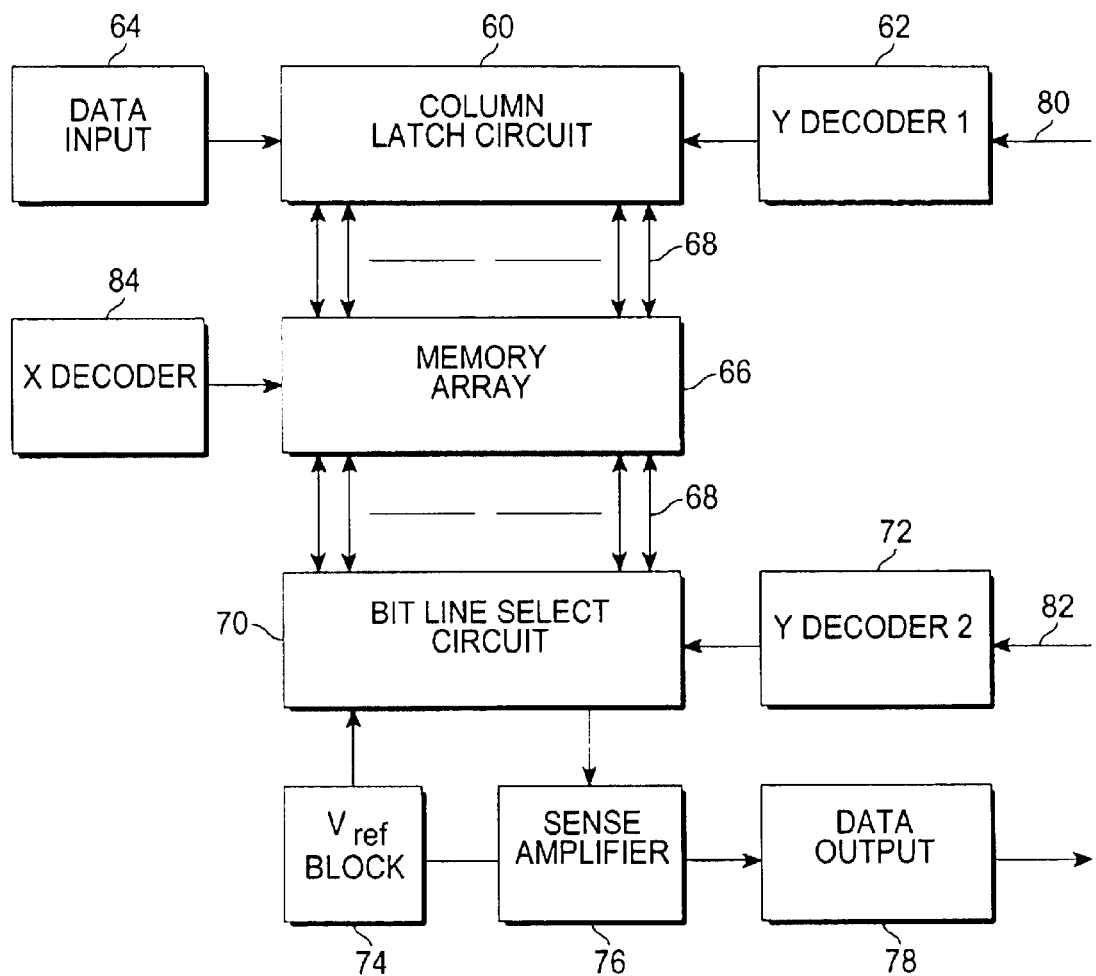
FIG. 2 is a block diagram that embodied the teachings of the present invention.

The present invention takes advantage of the fact that the loading stage of the programming operation does not require access to either the memory array, the bit lines, or the bit line select circuit. All it really needs is that the data input terminal be connected to the column latch, with the column latches being served by a separate Y decoder. In FIG. 2, which shows an embodiment of the present invention, a data input terminal 64 is connected exclusively to a column latch circuit 60. Data signals are loaded from the data input terminal directly into the selected column latches in the column latch circuit according to the decoded address provided by a first Y address decoder 62, which receives its address input from a first Y address bus 80.

Figure 1:
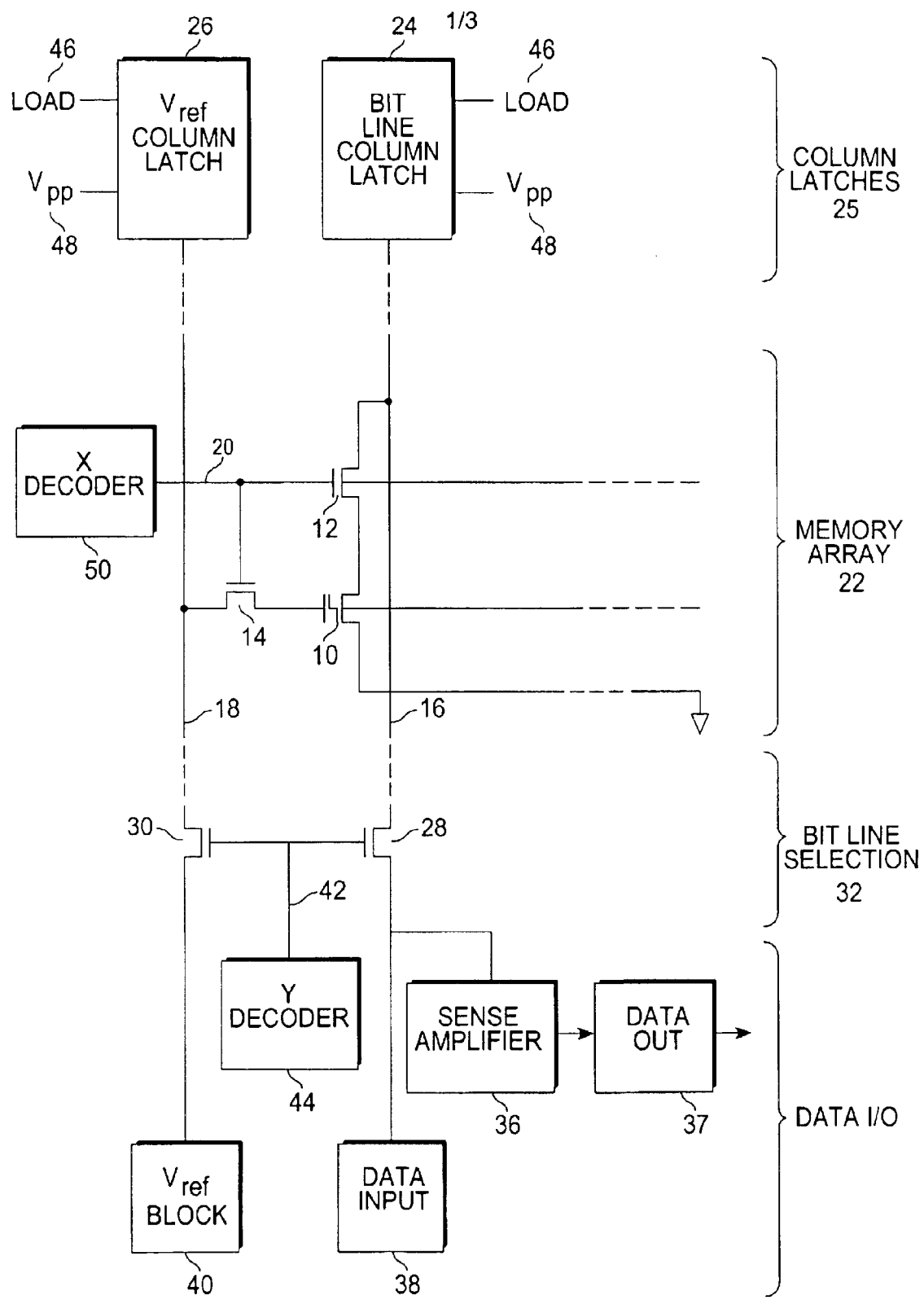
FIG. 1 is a circuit block diagram showing a memory array structure of the prior art.

The column latch circuit 60 is connected to a bit line select circuit 70 by a plurality of bit lines 68 through a memory array 66. The individual memory cells in the memory array 66 in the present invention are typically connected to the bit lines 68 (as well as Vref lines, word lines and ground) in the same manner as prior art memory cells (cf., elements 10–20 in FIG. 1). Individual memory cells in the memory array 66 are selected for reading by the bit line select circuit 70 and an X address decoder 84. The bit line select circuit is connected to a second Y address decoder 72, which receives its address input from a second Y address bus 82, and which provides decoded Y addresses for the purpose of reading memory cells. A Vref block 74 connected to the bit line select circuit 70 provides reference voltages to the memory array 66. A sense amplifier 76 connected to bit line select circuit 70 detects data signals stored in memory cells and sends detected signals out through a data output terminal 78.

The structural arrangement shown in FIG. 2 allows the loading of the column latch circuit 60 without engaging the memory array 66, the bit lines 68 and the bit line select circuit 70, thereby allowing the memory array 66 to be accessed by the sense amplifier 76 for reading purposes.

Figure 3:
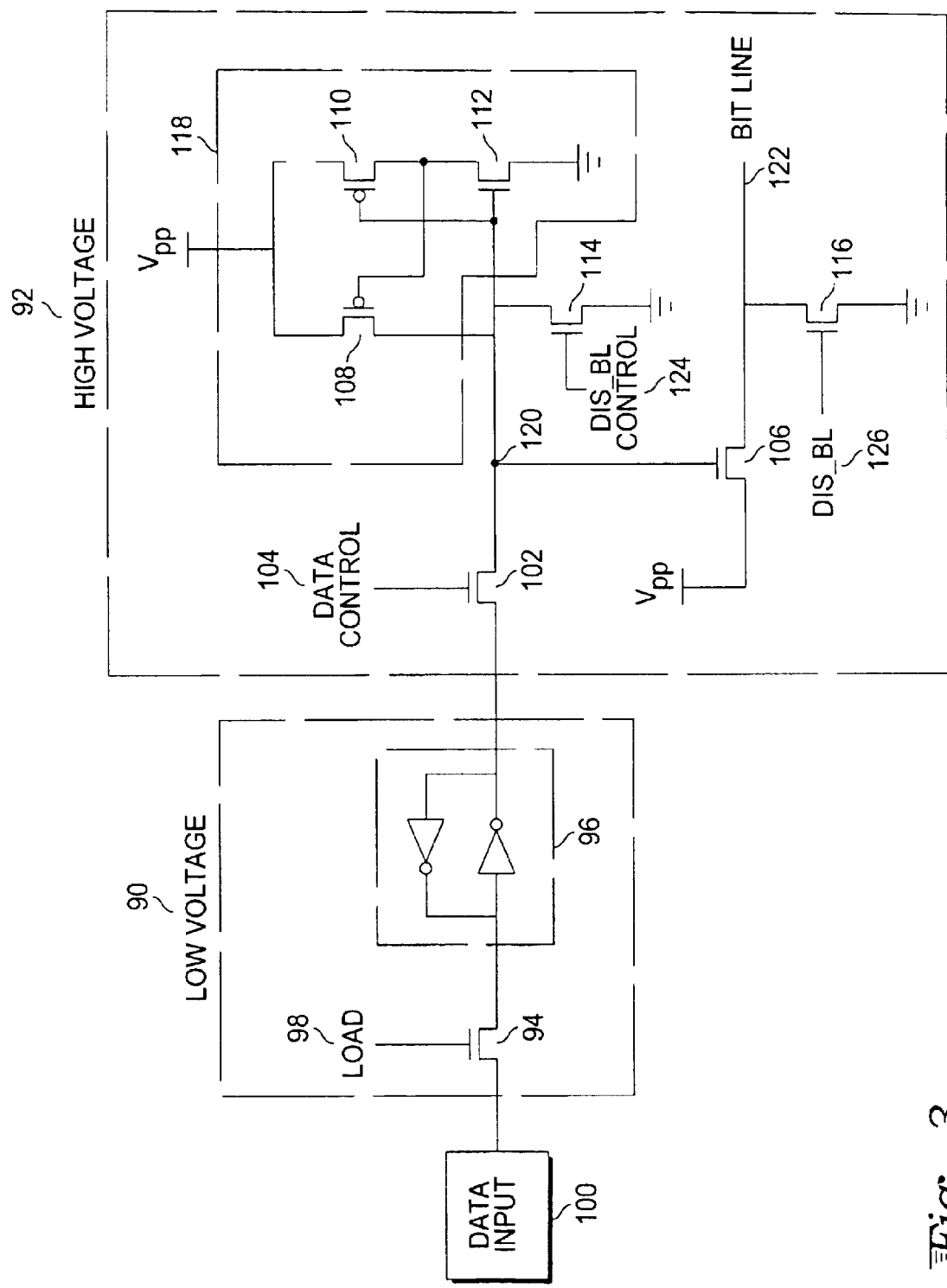
FIG. 3 is a circuit diagram showing a preferred embodiment of a column latch that is shown in FIG. 2.

FIG. 3 shows a preferred embodiment of a column latch that has a low voltage section 90 and a high voltage section 92. The low voltage section 90 includes a low voltage pass gate 94 connected to a latch circuit 96. The pass gate 94, being turned on and off by a load signal 98, connects the latch circuit 96 to a data input terminal 100 when it is turned on. The high voltage section 92 connects to the latch circuit 96 in the low voltage section 90 through a first high voltage pass gate 102, which is turned on and off by control signals DataCntl 104 received at its gate. The high voltage section 92 includes a level shifter 118 that is made up of a first high voltage PMOS transistor 108, a second high voltage PMOS transistor 110 and an high voltage NMOS transistor 112. The level shifter 118 monitors the voltage presented at its input/output node 120 by the latch 96 and switches between Vpp and ground. If a logic "1" is stored in the latch 96 and it is being presented at the input/output node 120 by an activated first high voltage pass transistor 104, the level shifter would apply a high voltage Vpp at its input/output node 120.

A first discharge transistor 114 is connected to the input/output node 120 of the level shifter 118 through its drain while its source is connected to ground. The first discharge transistor 114 is controlled by a Dis_BL_cntl signal line 124 connected to its gate. A second high voltage pass transistor 106 is connected to the input/output node 120 of the level shifter 118 through its gate. The drain of the second high voltage pass transistor 106 is connected to Vpp while its source is connected to the bit line 122. A second discharge transistor 116 is connected to the bit line 122 through its drain while its source is connected to the ground. The second discharge transistor 116 is activated by a Dis_BL signal line 126 connected to its gate.

During the loading of the column latch, only the low voltage section 90 is utilized. To load, data are presented by the data input terminal 100 at the drain of the low voltage pass transistor 94 while a load signal 98 is presented at its gate. The load signal 98 may be issued by the first Y address decoder 62 shown in FIG. 2 after it received an address signal from the first Y address bus 80. When the low voltage pass transistor 94 is activated, it allows data at the data input terminal 100 to be saved onto the latch circuit 96. At the same time, a high logic signal is sent to the gate of the first discharge transistor 114, driving the input/output node 120 low, thus ensuring the second high voltage pass transistor 106 stays off, which disconnects Vpp from the bit line 122. In addition, a low logic signal is sent to the gate of the second discharge transistor 116, keeping the second high voltage discharge transistor 116 off, thus allowing free reading of memory cells through the bit lines 122. Since loading delay does not depend on the bitline capacitance, this makes the loading operation faster and memory size insensitive.

During a write stage of the programming operation, a high logic signal 104 is sent to the gate of the first high voltage pass transistor 102, thereby connecting the low voltage section 90 to the high voltage section 92. Depending on the voltage value presented at the input/output node 120, which corresponds to the value store in the latch 96, the level shifter 118 switches to a high voltage Vpp or maintains a ground voltage at its input/output node 120. For instance, if a logic "1" is stored in the latch 96, the level shifter 118 will switch, driving its input/output node 120 high, thereby turning on the second high voltage pass transistor 106, which allows a high voltage Vpp to be transmitted to the bit line 122. With a high voltage Vpp presented on the bit line 122, a logic "0" is written onto the targeted memory cell. Alternatively, if a logic "0" is stored in the latch 96, the level shifter 118 will not switch, and thus the second high voltage pass transistor 106 will stay off, disconnecting the bit line 122 from the high voltage Vpp. In this case, the targeted memory is not written and it retains its erased value of logic "1".

To reset the column latches, data input terminal 100 presents a logic "1" while the low voltage pass transistor 94 is turned on by an assertive signal in the load signal line 98. Simultaneously, both the first and second discharge transistor 114 and 116 are turned on to discharge of any high voltage at the input/output node 120 of the level shifter 118 and at the bit line 122 respectively.

What we claim is:

1. An EEPROM memory circuit, comprising:
    an array of memory cells for the storage of digital data, said array tapped into a plurality of bit lines, said bit lines connected to a bit line select circuit at one end and to a column latch circuit at the other end;
    a first address decoder connected to said column latch circuit;
    a second address decoder connected to said bit line select circuit;
    a sense amplifier connected to said bit line select circuit; and
    a data input terminal connected directly to said column latch circuit without going through said bit lines, whereby the loading of said column latch circuit by said data input terminal and the reading of said memory array by said sense amplifier may be performed simultaneously.

2. The EEPROM memory circuit of claim 1, wherein each of said memory cells is composed of a select transistor and a floating gate transistor connected in series between a bit line and ground.

3. The EEPROM memory circuit of claim 1, wherein said column latch circuit comprises of a plurality of column latches, each of which having a low voltage section and a high voltage section,whereby the loading of said column latches utilize components in said low voltage section only.

4. The EEPROM of claim 3, wherein said low voltage section of said column latch comprises a low voltage pass gate having a drain connected to a data input terminal and a source connected to an input of a latch, whereby an activating signal at the gate of said transistor would turn on said low voltage pass transistor, allowing data in said data input circuit to be stored in said latch.

5. The EEPROM of claim 4, where said low voltage pass gate is an NMOS transistor.

6. The EEPROM of claim 3, wherein said high voltage section of said column latch comprises of a level shifter having an input/output node that is connected to an output of said latch in said low voltage section through a first high voltage pass transistor, whereby said level shifter would switches between a high voltage and ground depending on the signal it detected at said input/output node, said input/output node further connects to the gate of a second high voltage pass transistor that has a drain connected to a high voltage source and a source connected to said bit line whereby when said level shifter asserts a high voltage signal at its input/output node, a high voltage is applied to said bit line through said second high voltage pass transistor.

7. The EEPROM of claim 6, said level shifter comprising a first and a second PMOS transistor, said PMOS transistors having a source connect to a high voltage source, the gate of said second PMOS transistor and the drain of said first PMOS transistor being connected to said input/output node, the gate of said first PMOS transistor being connected to the drain of said second PMOS transistor, which is also connected to the source of a first NMOS transistor, the gate of said first NMOS transistor being connected to said input/output node while the drain of said first NMOS transistor being connected to ground.

8. The EEPROM of claim 6, wherein said input/output node of said level shifter is also connected to the drain of a first discharge transistor, the source of said first discharge transistor being connected to a ground and the gate of said first discharge transistor being connected to a signal line that would provide an assertive signal to ensure a ground voltage at said input/output node of said level shifter to allow reading of said memory array.

9. The EEPROM of claim 6, wherein said source of said second high voltage pass transistor is connected to the drain of a second discharge transistor, said second discharge transistor having a source connected to ground and a gate connected to a signal line that would provide an assertive to ensure a neutral voltage at said bit line during a reset operation.

10. A method for loading and reading an array of EEPROM memory cells comprising the steps:
  a) receiving a load signal and a load memory address;
  b) receiving a read signal and a read memory address;
  c) sending said load memory address to a first address decoder that is connected directly to a plurality of column latches;
  d) sending said read memory address to a second address decoder that is connected directly to a bit line select circuit;
  e) selecting column latches that are connected to the columns of memory cells that are specified by the decoded load memory address;
  f) selecting bit lines that are connected to the memory cells that are specified by the decoded read memory address;
  g) reading the content of said memory cells specified by said second address decoder through a sensing circuit connected to said selected bit lines;
  h) transferring data from a plurality of data terminals to the said column latches specified by said first address decoder, said data terminals being connected directly to said column latches without any connection to said bit lines, wherein the read sequence (steps b, d, f and g), and the load sequence (steps a, c, e, and h), are executed independently of each other.

11. The method of claim 10, wherein said step of transferring data from a plurality of data terminals to said column latch further comprising a step loading said data into a low voltage latch.

12. The method of claim 11, wherein said step of reading the content of said memory cells further comprising the steps of:
  a) connecting said low voltage latch to the input of a high voltage level shifter;
  b) having the output of said high voltage level shifter being responsive to the content of said low voltage latch; and
  c) having the output of said high voltage level shifter controls the activation of a high voltage pass gate that connects a high voltage source to a bitline.

* * * * *